United States Patent
Chiu et al.

(10) Patent No.: US 12,484,275 B2
(45) Date of Patent: Nov. 25, 2025

(54) GATE STRUCTURES FOR MULTI-GATE DEVICES

(71) Applicant: Taiwan Semiconductor Manufacturing Company, Ltd., Hsinchu (TW)

(72) Inventors: Shih-Hang Chiu, Taichung (TW); Wei-Cheng Wang, Hsinchu (TW); Kuan-Ting Liu, Hsinchu (TW); Chi On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 670 days.

(21) Appl. No.: 17/750,842

(22) Filed: May 23, 2022

(65) Prior Publication Data

US 2023/0317799 A1    Oct. 5, 2023

Related U.S. Application Data

(60) Provisional application No. 63/326,021, filed on Mar. 31, 2022.

(51) Int. Cl.
  *H10D 64/01*   (2025.01)
  *H01L 21/285*  (2006.01)
  (Continued)

(52) U.S. Cl.
  CPC ....... *H10D 64/01* (2025.01); *H01L 21/28568* (2013.01); *H10D 30/024* (2025.01); *H10D 30/62* (2025.01); *H10D 64/017* (2025.01)

(58) Field of Classification Search
  CPC ........ H01L 21/28568; H01L 21/28088; B82Y 10/00; H10D 30/024; H10D 30/62; H10D 30/43; H10D 30/014; H10D 30/797; H10D 64/01; H10D 64/017; H10D 64/518; H10D 64/691; H10D 84/038; H10D 84/834; H10D 84/0158; H10D 64/667; H10D 62/121; H10D 62/822
  See application file for complete search history.

(56) References Cited

U.S. PATENT DOCUMENTS

2003/0183877 A1* 10/2003 Yagishita ............. H10D 86/201
                                                           257/E21.703
2007/0026596 A1*  2/2007 Cho ................... H10D 84/0177
                                                           257/E21.636
(Continued)

FOREIGN PATENT DOCUMENTS

KR   20040053460 A   6/2004
TW    202109674 A    3/2021

*Primary Examiner* — Teresa M. Arroyo
(74) *Attorney, Agent, or Firm* — HAYNES AND BOONE, LLP

(57) ABSTRACT

A method according to the present disclosure includes providing a substrate that includes a dummy gate stack wrapping over an active region, and a spacer layer extending along sidewalls of the dummy gate stack, selectively removing the dummy gate stack to form a gate trench exposing the active region, depositing a gate dielectric over the active region, depositing at least one work function layer over the gate dielectric layer, depositing a tungsten layer over the at least one work function layer, and depositing a tungsten nitride layer over the tungsten layer.

20 Claims, 18 Drawing Sheets

(51) Int. Cl.
*H10D 30/01* (2025.01)
*H10D 30/62* (2025.01)

(56) References Cited

U.S. PATENT DOCUMENTS

| | | |
|---|---|---|
| 2011/0298062 A1 | 12/2011 | Ganguli |
| 2015/0147876 A1 | 5/2015 | Ando |
| 2015/0325662 A1* | 11/2015 | Wang ................ H01L 21/28088 |
| | | 438/589 |
| 2018/0012808 A1 | 1/2018 | Hsu |
| 2019/0157157 A1* | 5/2019 | Siddiqui ........... H01L 21/02332 |
| 2020/0066859 A1 | 2/2020 | Ando |
| 2021/0351273 A1 | 11/2021 | Tsai |
| 2022/0045051 A1 | 2/2022 | You et al. |

\* cited by examiner

GATE STRUCTURES FOR MULTI-GATE DEVICES

PRIORITY DATA

The present application claims the benefit of U.S. Provisional Application No. 63/326,021, entitled "GATE STRUCTURES FOR MULTI-GATE DEVICES," filed Mar. 31, 2022, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor.

Because a gate structure of a multi-gate transistor extends vertically to wraps over a fin or plurality of nanostructures, it can be challenging to form a gate structure without seams or void. Such seams or voids may cause unevenness when the gate structure is subjected to any gate recess processes. Therefore, while existing gate structures for multi-gate transistors are generally adequate for their general purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
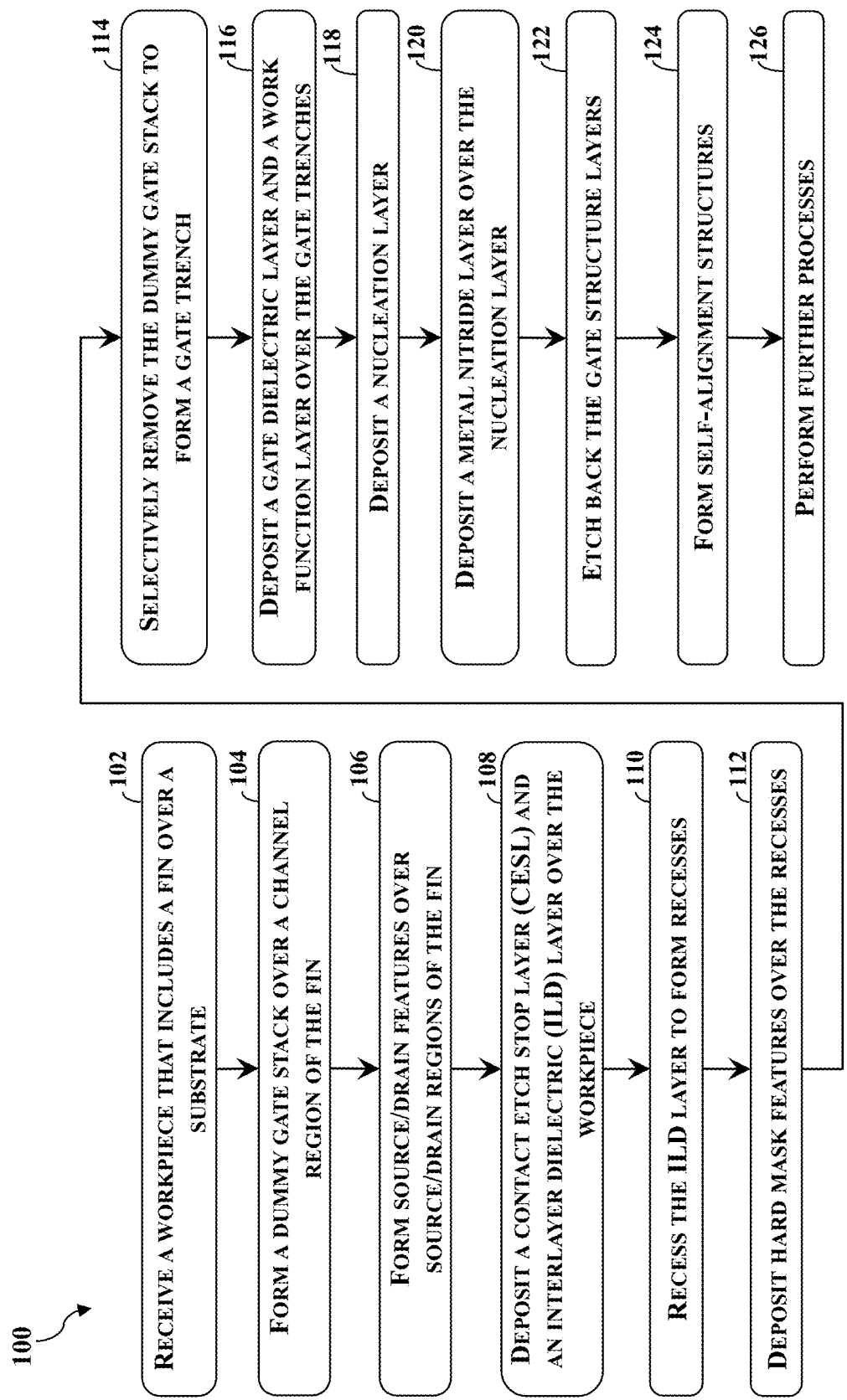
FIG. 1 is a flowchart illustrating a method of forming a semiconductor structure, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

As integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may include nanowires, nanosheets, or other nanostructures and for that reasons, an MBC transistor may also be referred to as a nanowire transistor or a nanosheet transistor.

The formation of MBC transistors is not without challenges. Multi-gate transistors may have small gate pitches, which makes it difficult to form gate structures. In some examples, titanium nitride may be deposited to serve as a metal fill layer of a gate structure. It is observed that while higher crystallinity and larger grain size of titanium nitride may help reduce resistance, larger column grains may lead to formation of a middle seam that exposes grain boundaries. When such a gate structure is subsequently subjected to an etch back process, the middle seam may promote lateral etching and prevents homogeneous anisotropic etching back. Lateral etching may enlarge the middle seam and increase the contact resistance between and the metal fill layer and a subsequently formed gate contact via.

The present disclosure provides a process to form a metal fill layer that is free of any middle seams. After a dummy gate structure is removed to define a gate trench, a gate dielectric layer and at least one work function metal layer are deposited. A metal layer is first deposited over the at least one work function metal layer using atomic layer deposition (ALD). Thereafter, a metal nitride layer is deposited over the tungsten layer to serve as a metal fill layer. The metal nitride layer is deposited using a plurality of deposition cycles followed by at least one nitrogen plasma treatment process. The metal nitride layer formed using the process described in the present disclosure is nanocrystalline (with a grain size smaller than 2 nm). The small grain size of the nanocrystalline metal nitride layer leads to good gap fill performance and a conductivity better than a titanium nitride layer formed using titanium tetrafluoride ($TiF_4$). Due to its good gap fill performance, the gate structure of the present disclosure may be free of a middle seam. When the gate structure of the present disclosure is recessed, lateral etching of the gate structure may be suppressed and the gate structure may be anisotropically etched back.

The various aspects of the present disclosure will now be described in more detail with reference to the figures. In that regard, FIG. 1 is a flowchart illustrating a method 100 of forming a semiconductor device according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments. Not all steps are described herein in detail for reasons of simplicity. Method 100 is described below in conjunction with FIG. 2-18, which are a fragmentary perspective view and cross-sectional views of a workpiece 200 at different stages of fabrication according to embodiments of the method 100 in FIG. 1. For avoidance of doubts, the X, Y and Z directions in FIGS. 2-18 are perpendicular to one another and are used consistently throughout FIGS. 2-18. Because the workpiece 200 will be fabricated into a semiconductor device or a semiconductor structure, the workpiece 200 may be referred to herein as a semiconductor device 200 or a semiconductor structure 200 as the context requires. Throughout the present disclosure, like reference numerals denote like features unless otherwise expressly excepted.

For illustration purposes, FIGS. 2-18 depict processes and structures for a FinFET where a gate structure wraps over a fin-shaped active region (i.e., a fin). However, the present disclosure is not so limited and it should be understood that the various embodiments of the present disclosure may be similarly applied to an MBC transistor where a gate structure wraps around each of a vertical stack of nano structures.

Figure 2:
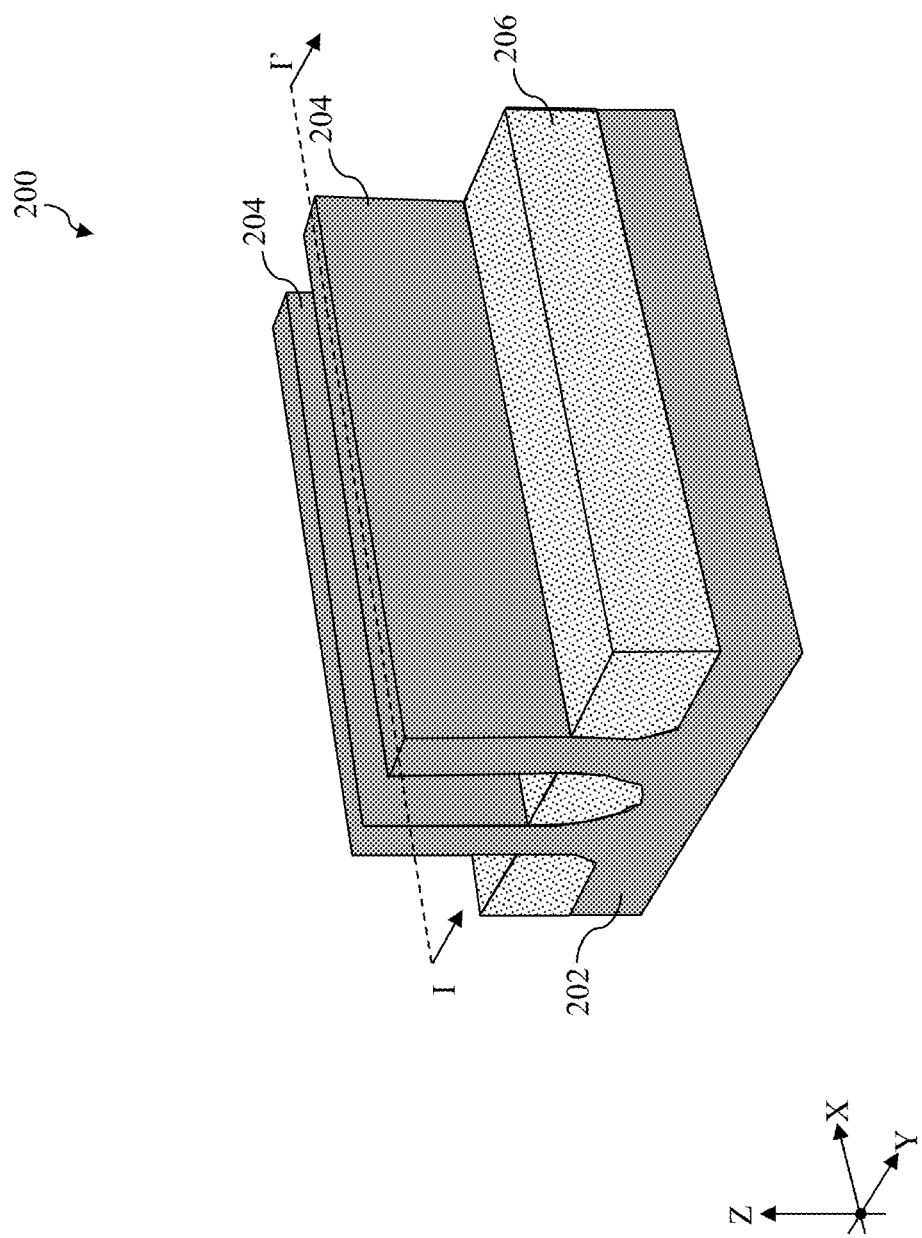
FIG. 2 is a schematic perspective view of a workpiece that includes fins over a substrate, according to various aspects of the present disclosure.

Referring now to FIGS. 1 and 2, the method 100 includes a block 102 where a workpiece 200 that includes a fin 204 over a substrate 202 is received. The perspective view of the workpiece 200 in FIG. 2 illustrate two fins 204 extending from the substrate 202. In some embodiments, the substrate 202 includes silicon (Si). Alternatively or additionally, substrate 202 includes another elementary semiconductor, such as germanium (Ge); a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, the substrate 202 includes one or more group III-V materials, one or more group II-IV materials, or combinations thereof. In some implementations, the substrate 202 is a semiconductor-on-insulator substrate, such as a silicon-on-insulator (SOI) substrate, a silicon germanium-on-insulator (SGOI) substrate, or a germanium-on-insulator (GeOI) substrate. Semiconductor-on-insulator substrates can be fabricated using separation by implantation of oxygen (SIMOX), wafer bonding, and/or other suitable methods. While not explicitly shown in FIG. 2, the substrate 202 can include various doped regions configured according to design requirements of the desired semiconductor device. The various doped regions can be formed directly on and/or in substrate 202 by doping with p-type dopants or n-type dopants to provide a p-well structure, an n-well structure, or combinations thereof. Example p-type dopants may include boron (B), boron difluoride ($BF_2$), other p-type dopant, or combinations thereof. Example n-type dopants may include phosphorus (P), arsenic (As), other n-type dopant, or combinations thereof. An ion implantation process, a diffusion process, and/or other suitable doping process can be performed to form the various doped regions.

The fins 204, which extend lengthwise along the X direction, may be formed from the substrate 202 or an epitaxial layer deposited on the substrate 202. When an n-type FinFET is desired, such an epitaxial layer may be a silicon (Si) layer. When a p-type FinFET is desired, such an epitaxial layer may be a silicon germanium (SiGe) layer. To form the fins 204, the substrate 202, alone or together with the epitaxial layer (if formed), undergoes photolithography processes and etch processes to pattern the fins 204. In some instances, patterning of the fins 204 may include use of double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process.

As shown in FIG. 2, the fins 204 are spaced apart from one another along the Y direction by an isolation feature 206. The isolation feature 206 may also be referred to as a shallow trench isolation (STI) feature 206. In an example process, a dielectric material for the isolation feature 206 is first deposited over the workpiece 200, filling the trenches between fins 204 with the dielectric material. In some embodiments, the dielectric material may include silicon oxide, silicon oxynitride, fluorine-doped silicate glass (FSG), a low-k dielectric, combinations thereof, and/or other suitable materials. In various examples, the dielectric material may be deposited by a CVD process, a flowable CVD (FCVD) process, spin-on coating, and/or other suitable process. The deposited dielectric material is then thinned and planarized, for example by a chemical mechanical polishing (CMP) process, until top surfaces of the fins 204 are exposed. The planarized dielectric material is further recessed or etched back by a dry etching process, a wet etching process, and/or a combination thereof to form the isolation feature 206. In some embodiments represented in FIG. 2, at least a portion of each of the fins 204 rises above the isolation feature 206.

Figure 3:
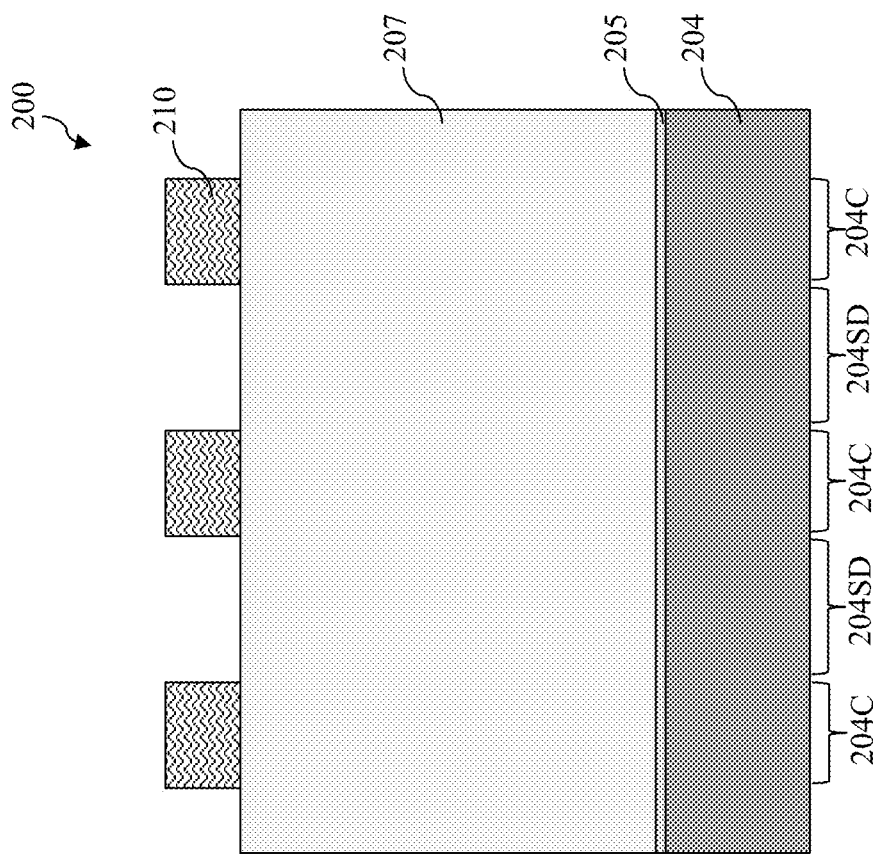
FIGS. 3-18 illustrate fragmentary cross-sectional views of a workpiece at various stages of fabrication in accordance with the method in FIG. 1, according to various aspects of present disclosure.
Figure 4:
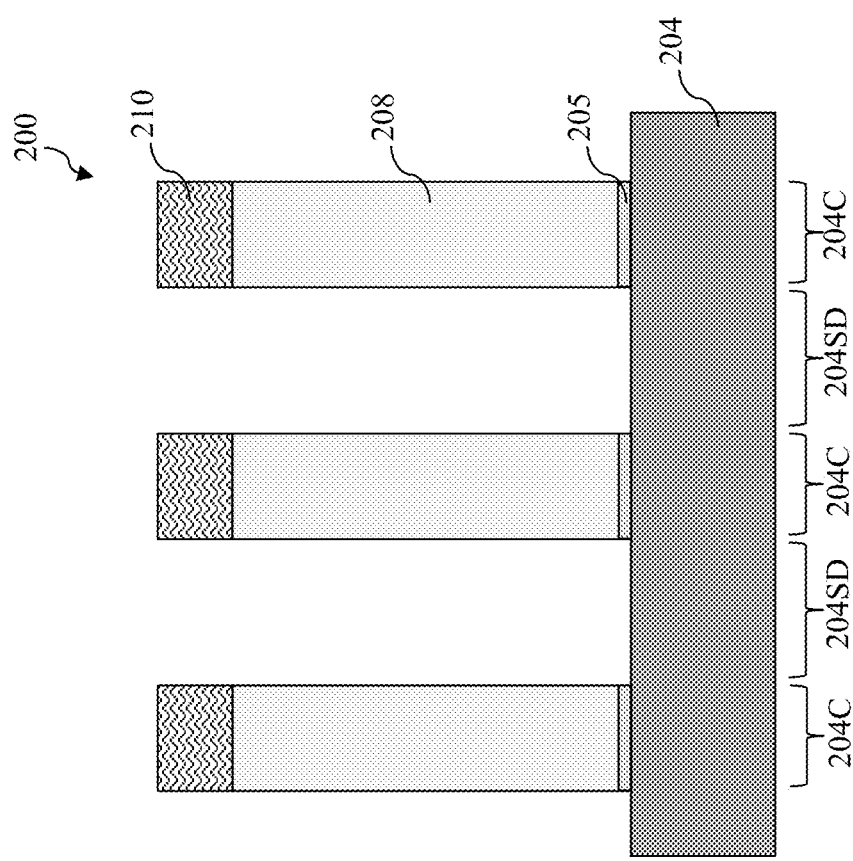

Referring to FIGS. 1, 3 and 4, method 100 includes a block 104 where a dummy gate stack 208 is formed over a channel region 204C of the fin 204. Each of FIGS. 3 and 4 illustrates a fragmentary cross-sectional view along line I-I' in FIG. 2 through a length of a fin 204. Referring to FIG. 3, to form the dummy gate stack 208, a dummy gate dielectric layer 205 and a material layer 207 are first blanketly deposited over the workpiece 200, including over the fins 204. In some instances, the dummy gate dielectric layer 205 may include silicon oxide and may be formed using an oxidation process. The material layer 207 may include polysilicon and may be deposited using CVD. Photolithography processes and etching processes are then used to pattern the dummy gate dielectric layer 205 and the material layer 207 in FIG. 3 into the dummy gate stacks 208 shown in FIG. 4. In an example process, a mask layer 210 is deposited over the material layer 207 using CVD, FCVD, or spin-on coating and photolithography processes are performed to pattern the mask layer 210 into a patterned mask layer 210 shown in FIG. 3. The mask layer 210 may be a photoresist layer, a hard mask layer, or a combination thereof. The patterned mask layer 210 is then applied as an etch mask in one or more etching processes to pattern the material layer 207 and the dummy gate dielectric layer 205 into the dummy gate stacks 208 shown in FIG. 4. While not explicitly shown in the figures, the dummy gate stacks 208 may be patterned using double-patterning or multiple-patterning processes.

Each of the dummy gate stacks 208 extends lengthwise along the Y direction, which is perpendicular to the direction along which the fins 204 extend. As shown in FIG. 4, the dummy gate stacks 208 are disposed over channel regions 204C of the fin 204 and the regions of the fin 204 not underlying a dummy gate stack 208 are the source/drain regions 204SD. Each of the channel regions 204C is disposed between two source/drain regions 204SD. Each of the dummy gate stacks 208 includes the dummy gate dielectric layer 205 and a dummy gate electrode formed of the material layer 207.

Figure 5:
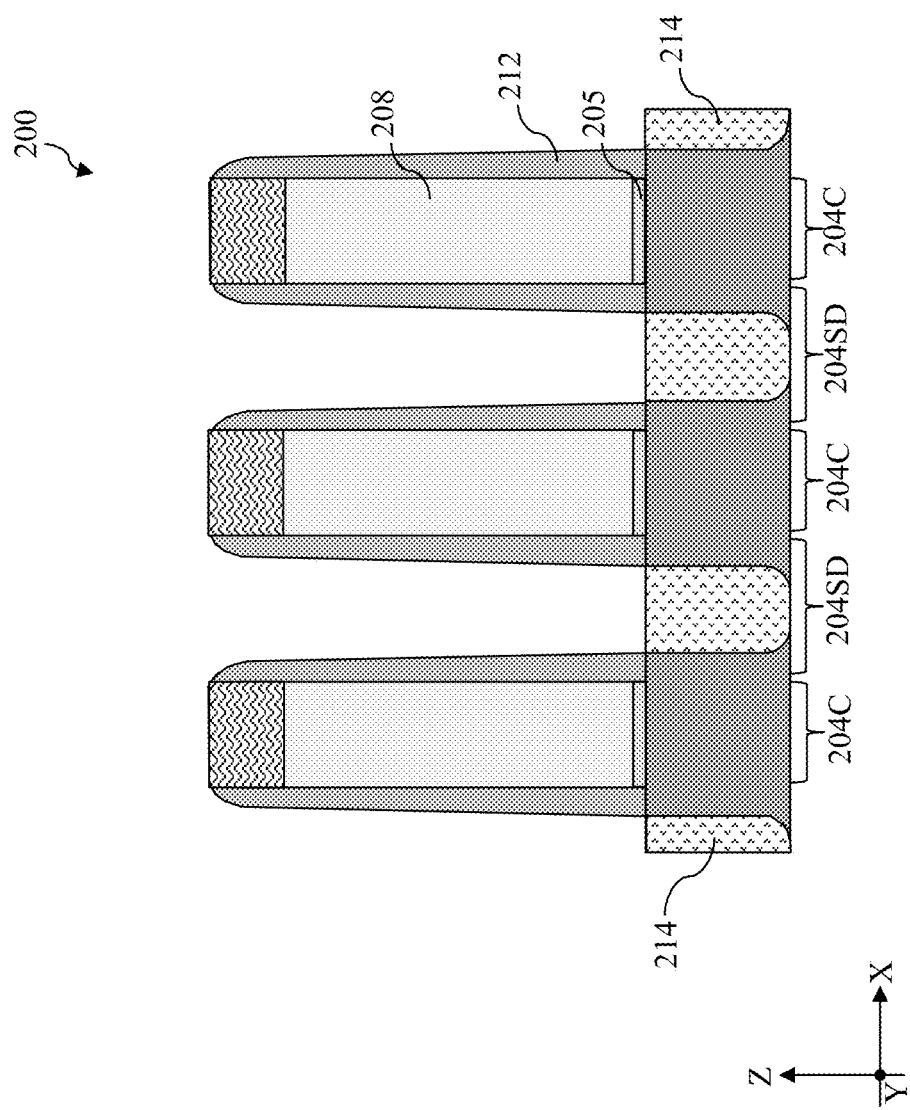

Referring to FIGS. 1 and 5, method 100 includes a block 106 where source/drain features 214 are formed over source/drain regions 204SD of the fin 204. Operations at block 106 may include deposition of at least one gate spacer layer 212, recessing of the source/drain regions 204SD to form source/drain recesses, and deposition of the source/drain features 214 in the source/drain recesses. To protect the dummy gate stacks 208 and to later define a gate trench, the at least one gate spacer layer 212 is blanketly deposited over the workpiece 200, including over the dummy gate stacks 208 and the source/drain regions 204SD of the fins 204. The at least one gate spacer layer 212 may include silicon oxide, silicon nitride, silicon oxynitride, silicon carbonitride, silicon oxycarbonitride, or a combination thereof and may be deposited using CVD. After the deposition of the at least one gate spacer layer 212, the workpiece 200 is subjected to an anisotropic etch process. An example anisotropic etch process is a dry etch process that includes use of a fluorocarbon (e.g., $CF_4$, $SF_6$, $NF_3$, $CH_2F_2$, $CHF_3$, and/or $C_2F_6$), a chlorine-containing gas (e.g., $Cl_2$, $CHCl_3$, $CCl_4$, and/or $BCl_3$), oxygen ($O_2$), hydrogen ($H_2$), argon (Ar), or a combination thereof. The anisotropic etch process removes the at least one gate spacer layer 212 on top-facing surfaces and leaves behind the at least one gate spacer layer 212 disposed on sidewalls of the dummy gate stacks 208. With the mask layer 210 protecting top surfaces of the dummy gate stacks 208, the anisotropic etch process recesses the source/drain regions 204SD of the fins 204 to form source/drain recesses. After a cleaning process, source/drain features 214 are epitaxially deposited in the source/drain recesses using a suitable technique, such as vapor-phase epitaxy (VPE), ultra-high vacuum CVD (UHV-CVD), a cyclic deposition and etching (CDE) process, molecular beam epitaxy (MBE), and/or other suitable processes. Depending on the conductivity of the desired device, the source/drain features 214 may be n-type or p-type. When the desired device is n-type, the source/drain features 214 may be phosphorus-doped silicon (Si:P) or arsenic-doped silicon (Si:As). When the desired device is p-type, the source/drain features 214 may be boron-doped silicon germanium (SiGe:B).

Figure 6:
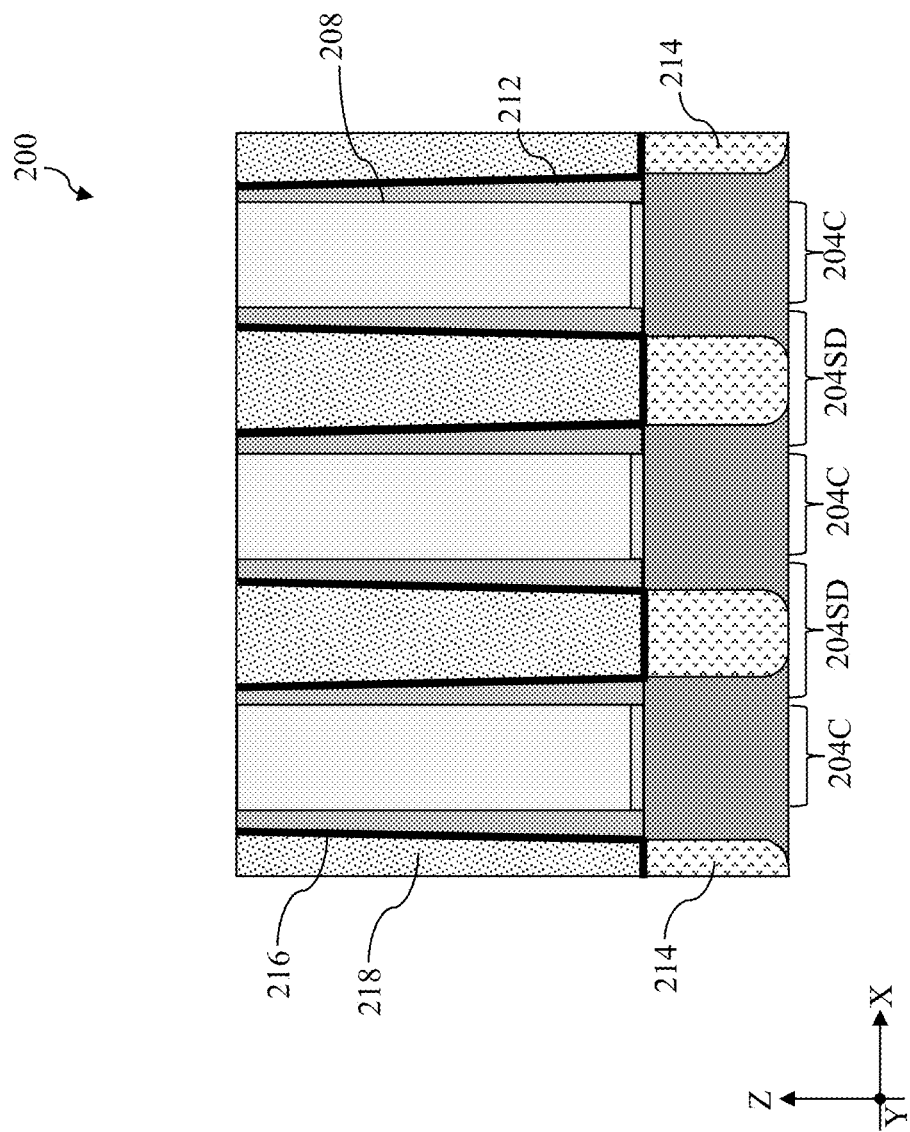

Referring to FIGS. 1 and 6, method 100 includes a block 108 where a contact etch stop layer (CESL) 216 and an interlayer dielectric (ILD) layer 218 are deposited over the workpiece 200. At block 108, the CESL 216 is conformally deposited over the source/drain features 214, the at least one gate spacer layer 212, and patterned mask layer 210. In some embodiments, the CESL 216 may be deposited using CVD or ALD and may include silicon nitride or silicon oxynitride. After the deposition of the CESL 216, the ILD layer 218 is deposited over the CESL 216. In some implementations, the ILD layer 218 may be deposited using CVD, FCVD, spin-on coating, or a suitable deposition method. The ILD layer 218 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. After the deposition of the CESL 216 and the ILD layer 218, a planarization process, such as a chemical mechanical polishing (CMP) process, is performed to the workpiece 200 until top surfaces of the dummy gate stacks 208, and the ILD layer 218, and the CESL 216 are coplanar. It is noted that the patterned mask layer 210 is also removed by the planarization process.

Figure 7:
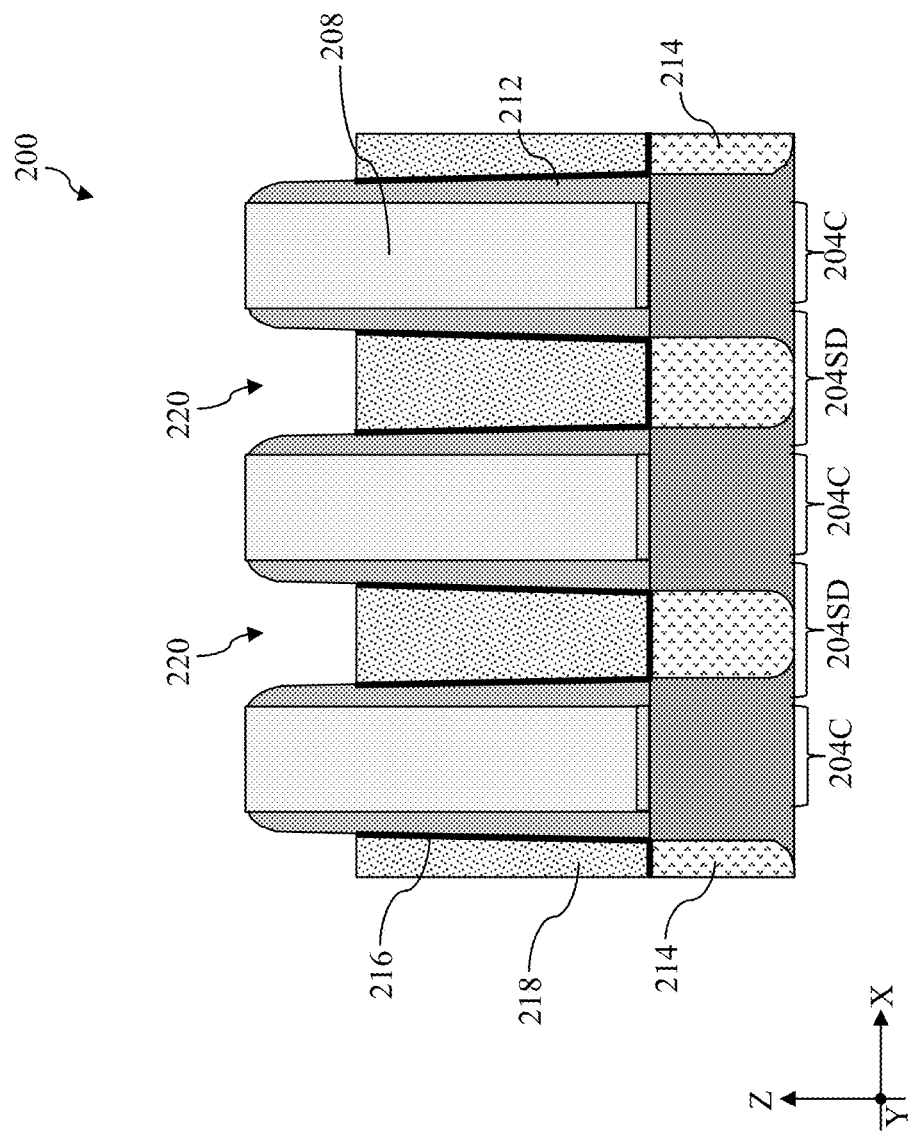

Referring to FIGS. 1 and 7, method 100 includes a block 110 where the ILD layer 218 are selectively recessed to form recesses 220. In some embodiments, the composition of the ILD layer 218 is different from those of the CESL 216, the at least one gate spacer layer 212, and the dummy gate stacks 208. This compositional difference allows selective recessing of the ILD layer 218. In some embodiments, the ILD layer 218 may be recessed by using a dry etch, a wet etch, or a combination thereof. An example dry etching process may include use of a fluorocarbon (e.g., $CF_4$, $SF_6$, $NF_3$, $CH_2F_2$, $CHF_3$, and/or $C_2F_6$), oxygen ($O_2$), hydrogen ($H_2$), argon (Ar), or a combination thereof. An example wet etch process may include use of buffered hydrofluoric acid (BHF, a mixture of hydrofluoric acid and ammonium fluoride). In some implementations, a portion of the CESL 216 may be removed during the recessing of the ILD layer 218. The selective recessing of the ILD layer 218 forms recesses 220.

Figure 8:
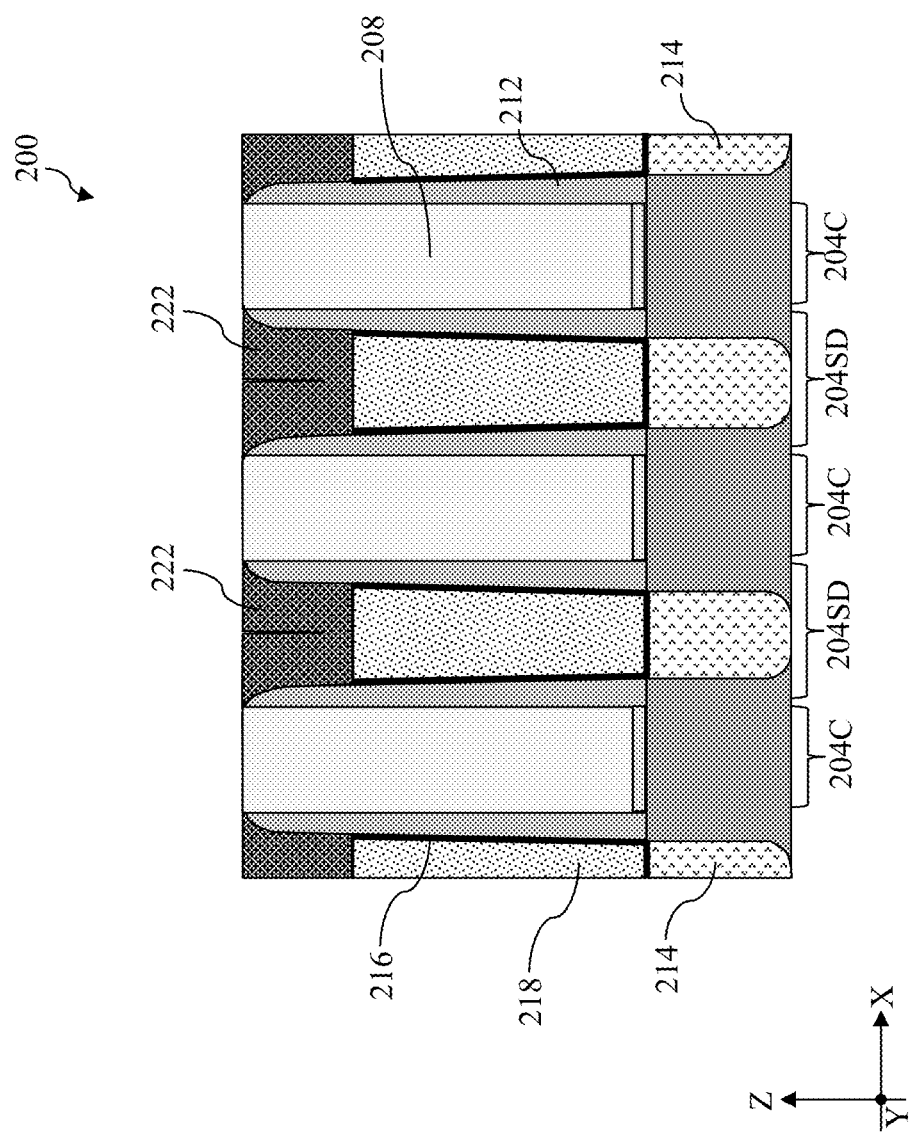

Referring to FIGS. 1 and 8, method 100 includes a block 112 where a hard mask features 222 are formed over the recesses 220. To form the hard mask features 222, a hard mask layer is conformally deposited over the workpiece 200, including over the recesses 220, using CVD. As shown in FIG. 8, the conformal hard mask layer may extend along sidewalls of the recesses 220. When the conformal hard mask layer on two sidewalls merge, a seam may form along a center line of the recesses 220. After the conformal deposition of the hard mask layer, the workpiece 200 is planarized using a chemical mechanical polishing (CMP) to form the hard mask features 222. Top surfaces of the hard mask features 222 is coplanar with top surfaces of the dummy gate stacks 208.

Figure 9:
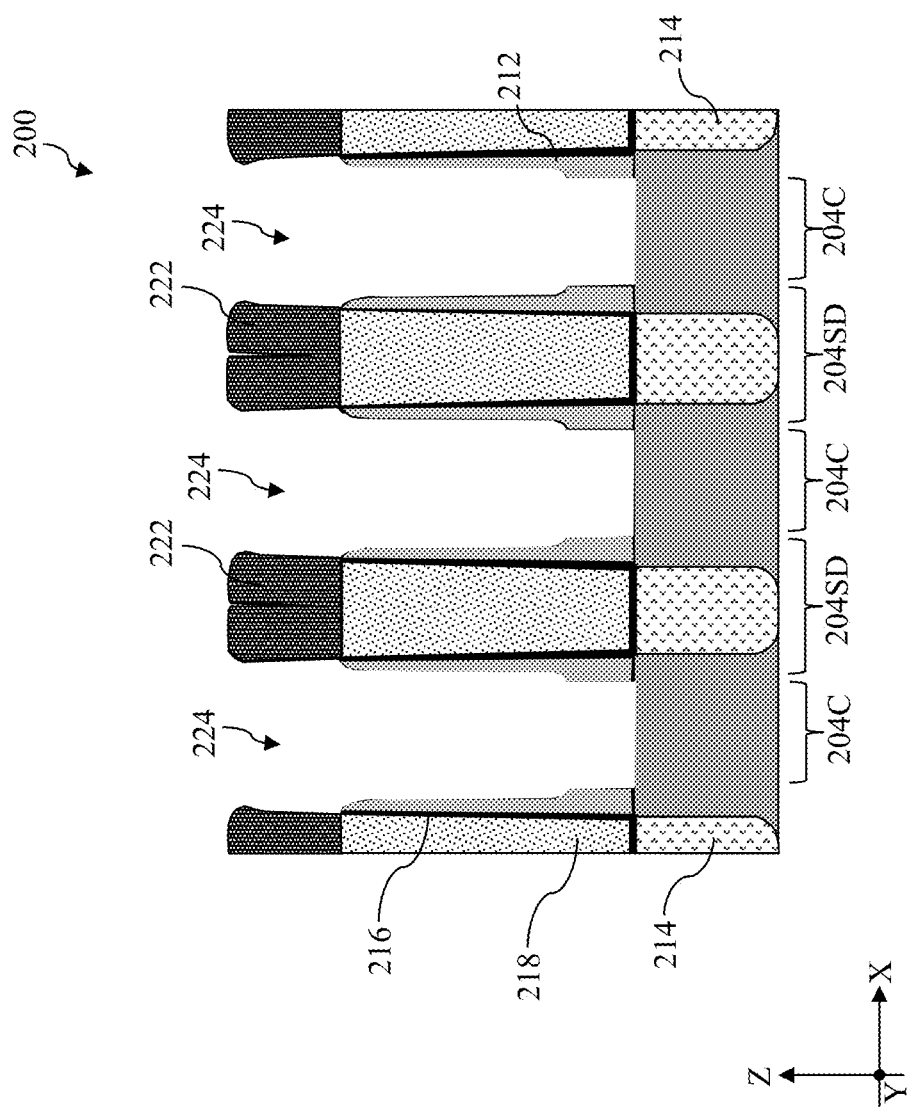

Referring to FIGS. 1 and 9, method 100 includes a block 114 where the dummy gate stack 208 is selectively removed to form a gate trench 224. The removal of the dummy gate stack 208 may include one or more etching processes that are selective to the material in the dummy gate stack 208 and the dummy gate dielectric layer 205. For example, the removal of the dummy gate stack 208 may be performed using as a selective wet etch, a selective dry etch, or a combination thereof. After the dummy gate stacks 208 are remove, gate trenches 224 are formed. As shown in FIG. 9, along the X direction, an upper portion of the gate trench 224 is defined between two hard mask features 222 and a lower portion of the gate trench 224 is defined between the at least two gate spacer layers 212 disposed along sidewalls of the dummy gate stacks 208.

Figure 10:
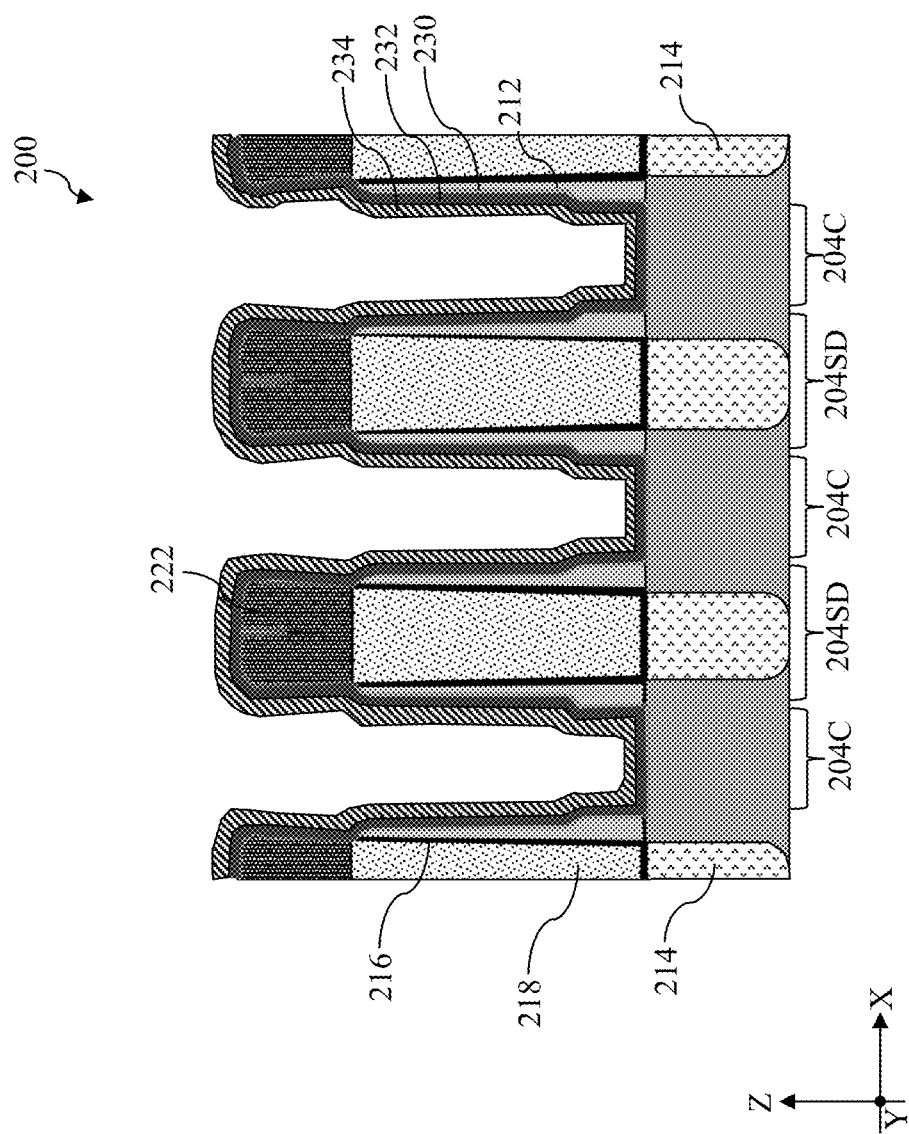

Referring to FIGS. 1 and 10, method 100 includes a block 116 where a gate dielectric layer 232 and at least one work function layer 234 are deposited over the gate trench 224. At block 116, an interfacial layer 230 is first deposited over the workpiece 200, including over the gate trench 224. The gate dielectric layer 232 is deposited on the interfacial layer 230. Then at least one work function layer 234 is then deposited on the gate dielectric layer 232. In some embodiments, the interfacial layer 230 may include silicon oxide or other suitable material. In some embodiments, the interfacial layer 230 may be formed or deposited using a suitable method, such as atomic layer deposition (ALD), chemical vapor deposition (CVD), thermal oxidation, or other suitable method. The interfacial layer 230 serves to control and reduce gate leakage current and improve interfacial adhesion between the gate dielectric layer 232 and channel regions 204C of the fins 204. In some embodiments, the gate dielectric layer 232 is high-k dielectric layer as its dielectric constant is greater than that of silicon dioxide (~3.9). In some implementations, the gate dielectric layer 232 may include titanium oxide ($TiO_2$), tantalum oxide ($Ta_2O_5$), hafnium silicon oxide ($HfSiO_4$), zirconium oxide ($ZrO_2$), zirconium silicon oxide ($ZrSiO_2$), aluminum oxide ($Al_2O_3$), zirconium oxide (ZrO), yttrium oxide ($Y_2O_3$), $SrTiO_3$ (STO), $BaTiO_3$ (BTO), $BaZrO_3$, aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material.

While not explicitly shown in the figures, the gate dielectric layer 232 may include a dipole layer component. To form a gate dielectric layer 232 with a dipole component, a hafnium oxide layer is deposited over the interfacial layer 230 using ALD. After the deposition of the hafnium oxide layer, a dipole inducing layer is then deposited over the hafnium oxide layer. An anneal process is then performed to drive the dipole inducing layer into the hafnium oxide matrix to form the gate dielectric layer 232. The dipole inducing layer may include lanthanum oxide, aluminum oxide, or zirconium oxide. As a result, the gate dielectric layer 232 in these embodiments may include hafnium lanthanum oxide (HfLaO), hafnium aluminum oxide (HfAlO), or hafnium zirconium oxide (HfZrO). In some embodiments, excess dipole inducing layer may be removed after the anneal process.

After the formation of the gate dielectric layer 232, at least one work function layer 234 is deposited over the gate dielectric layer 232. The at least one work function layer 234 may be n-type or p-type. When the at least one work function layer 234 is n-type, it may include titanium (Ti), aluminum (Al), carbon (C), magnesium (Mg), or a combination thereof. In one embodiment, when the at least one work function layer 234 is n-type, it may include (TiAlC). When the at least one work function layer 234 is p-type, it may include titanium (Ti), tantalum (Ta), tungsten (W), molybdenum (Mo), zirconium (Zr), vanadium (V), niobium (Nb), nitrogen (N), carbon (C), ruthenium (Ru), platinum (Pt), or nickel (Ni). In one embodiment, when the at least one work function layer 234 is p-type, it may include titanium nitride (TiN). The at least one work function layer 234 may be deposited using atomic layer deposition (ALD). In some embodiments not explicitly shown in the figures, when the at least one work function layer 234 is n-type, a capping layer may be deposited over the at least one work function layer 234 to prevent out-diffusion of aluminum (Al). In some embodiments, the capping layer may include titanium, nitrogen, oxygen, or silicon. In one embodiment, the capping layer may include titanium nitride.

Figure 11:
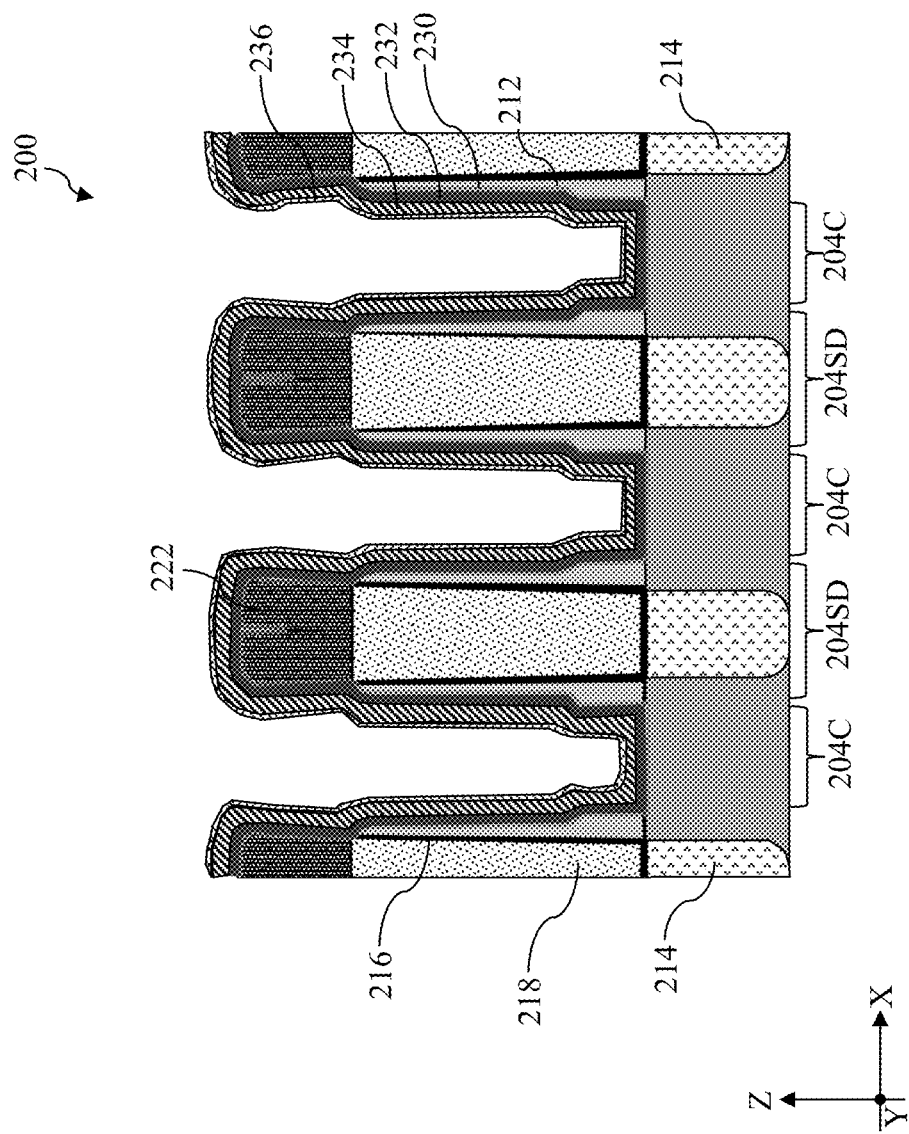

Referring to FIGS. 1 and 11, method 100 includes a block 118 where a nucleation layer 236 is deposited over the at least one work function layer. In some embodiments, the nucleation layer 236 includes tungsten (W) and is formed using ALD. An example ALD process to form the nucleation layer 236 includes multiple cycles. Each of the cycles includes a metal precursor gas pulse, an inert gas purging pulse, a reducing gas pulse, and another inert gas purging pulse. The cycle may be repeated 2 to 4 times until the nucleation layer 236 reaches a thickness between about 10 Å and about 30 Å. In some embodiments, the metal precursor gas may include tungsten pentachloride ($WCl_5$) or tungsten hexafluoride ($WF_6$). The inert gas may include argon (Ar). The reducing gas may include diborane ($B_2H_6$), silane ($SiH_4$), hydrogen ($H_2$), or a combination thereof. When the metal precursor gas is tungsten pentachloride ($WCl_5$), the resulting tungsten nucleation layer is free of fluorine (F) and may be referred to as a fluorine-free tungsten layer. Because the deposition of the nucleation layer 236 does not include treatment of a nitrogen-containing gas, the nucleation layer 236 is substantially nitrogen-free when deposited. The deposition of the nucleation layer 236 includes a process temperature between about 275° C. and about 300° C.

Figure 12:
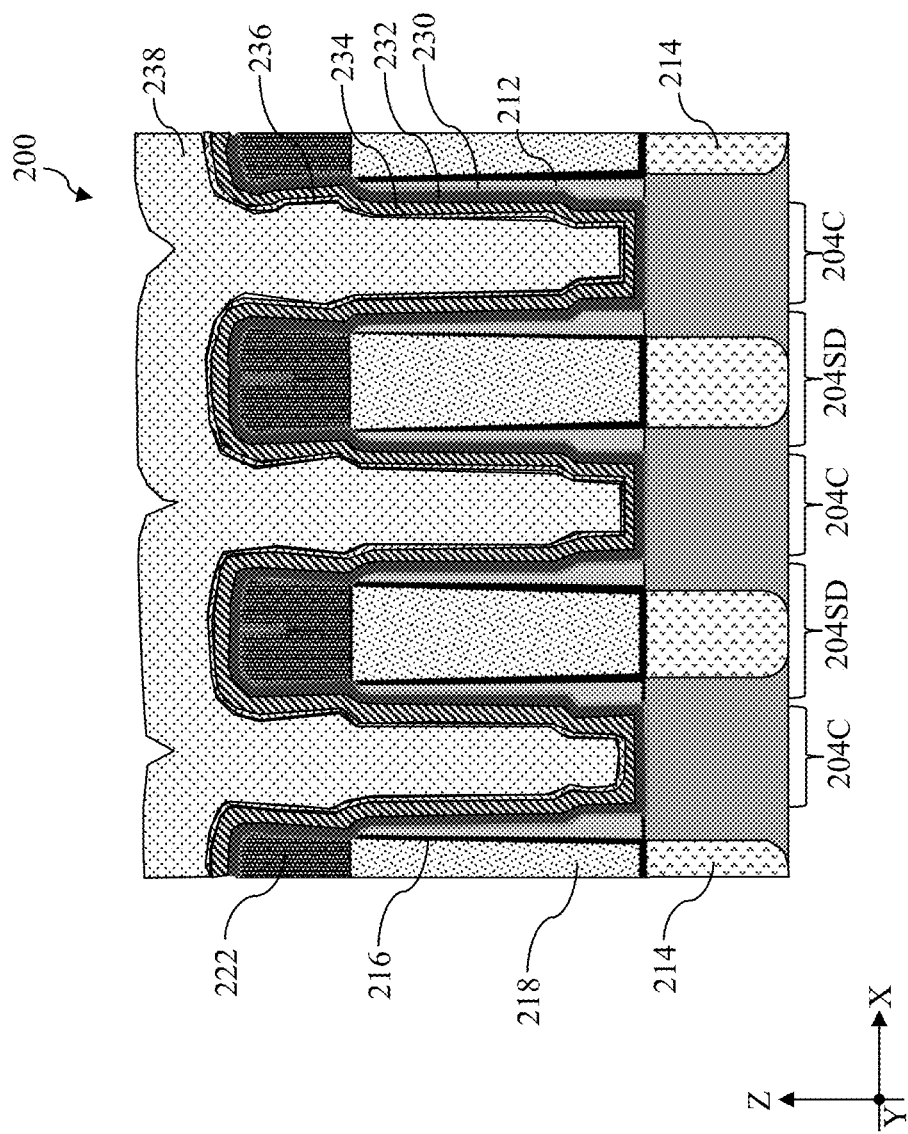

Referring to FIGS. 1 and 12, method 100 includes a block 120 where a metal nitride layer 238 is deposited over the nucleation layer 236. In the depicted embodiment, the metal nitride layer 238 is deposited using an ALD process that includes a plurality of deposition cycles followed by a plasma treatment cycle. In one embodiment where the metal nitride layer 238 include tungsten nitride, each of the plurality of deposition cycles includes a metal precursor gas pulse, an inert gas purging pulse, a reducing gas pulse, and another inert gas purging pulse and the plasma treatment cycle includes treatment using a plasma of a nitrogen containing gas, such as nitrogen ($N_2$), ammonia ($NH_3$), or a mixture of nitrogen ($N_2$) and hydrogen ($H_2$). In some embodiments, the metal precursor gas may include tungsten pentachloride ($WCl_5$) or tungsten hexafluoride ($WF_6$). The inert gas may include argon (Ar). The reducing gas may include diborane ($B_2H_6$), silane ($SiH_4$), hydrogen ($H_2$), or a combination thereof. When the metal precursor gas is tungsten pentachloride ($WCl_5$), the resulting tungsten nucleation layer is free of fluorine and may be referred to as a fluorine-free tungsten layer. During the plasma treatment cycle, nitrogen in the nitrogen-containing plasma reacts with deposited tungsten to form tungsten nitride. The ALD process at block 120 may be repeated until the metal nitride layer 238 reaches a desired thickness.

In some implementations, the plurality of deposition cycles may include between 2 and 8 deposition cycles. In other words, a ratio of a number of the deposition cycle to a number of the plasma treatment cycle is between 2 and 8. The foregoing ALD process represents a balance of conductivity of the metal nitride layer 238 and a grain size thereof. When the number of deposition cycles is greater than 8 or when there is no plasma treatment cycle, the metal nitride layer 238 may be substantially free of nitrogen (i.e., including just tungsten, for example) and have good electrical conductivity. Here, electrical conductivity is described as "good" when it is greater than that of titanium nitride (TiN). However, when there is few or no plasma treatment, the grain size may become too large that column grain structures and a middle seam may form, which, as described above, is undesirable because it may increase contact resistance. Because pure tungsten nitride is less conductive than titanium nitride, when the ratio (of a number of the deposition cycle to a number of the plasma treatment cycle) is smaller than 2, the metal nitride layer 238 may be less electrically conductive than titanium nitride. It is observed, when the ratio of the number of the deposition cycle to the number of the plasma treatment cycle is between 2 and 8, the metal nitride layer 238 will be nanocrystalline with an average grain size smaller than 2 nm. The small grain size allows the ALD process at block 120 to have satisfactory gap filling properties to avoid formation of a middle seam. Because the ratio of the number of the deposition cycle to the number of the plasma treatment cycle is between 2 and 8, a tungsten content (W %) in the metal nitride layer 238 may be between about 80% and about 90%, the nitrogen content (N %) in the metal nitride layer 238 may be smaller than 10%, for example, between about 1% and about 10%, and the fluorine content (F %) in the metal nitride layer 238 may be smaller than 3%. The interfacial layer 230, the gate dielectric layer 232, the at least one work function layer 234, the nucleation layer 236, and the metal nitride layer 238 are all layers in a gate structure and may be collectively referred to as gate structure layers.

Figure 13:
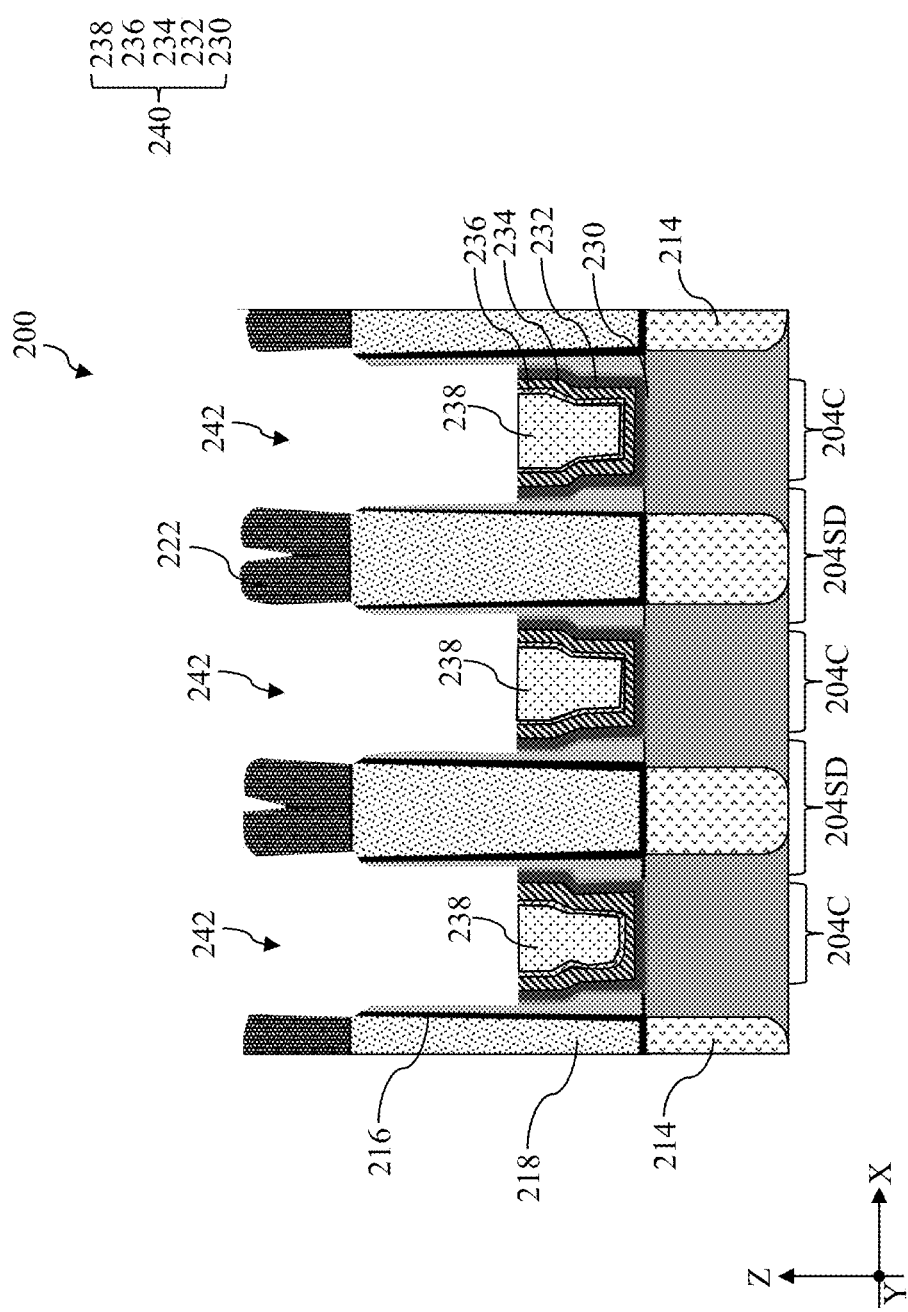
Figure 14:
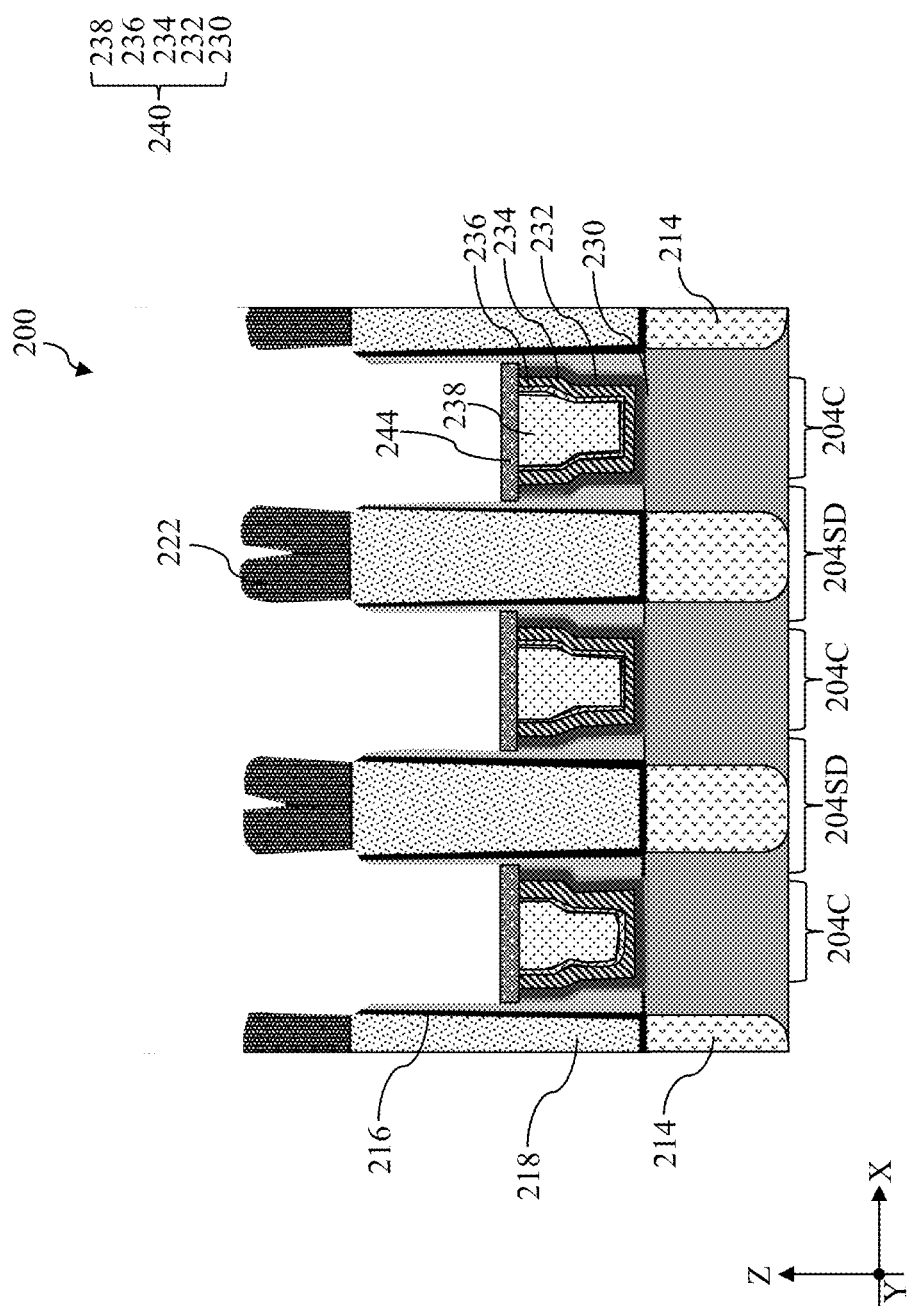
Figure 15:
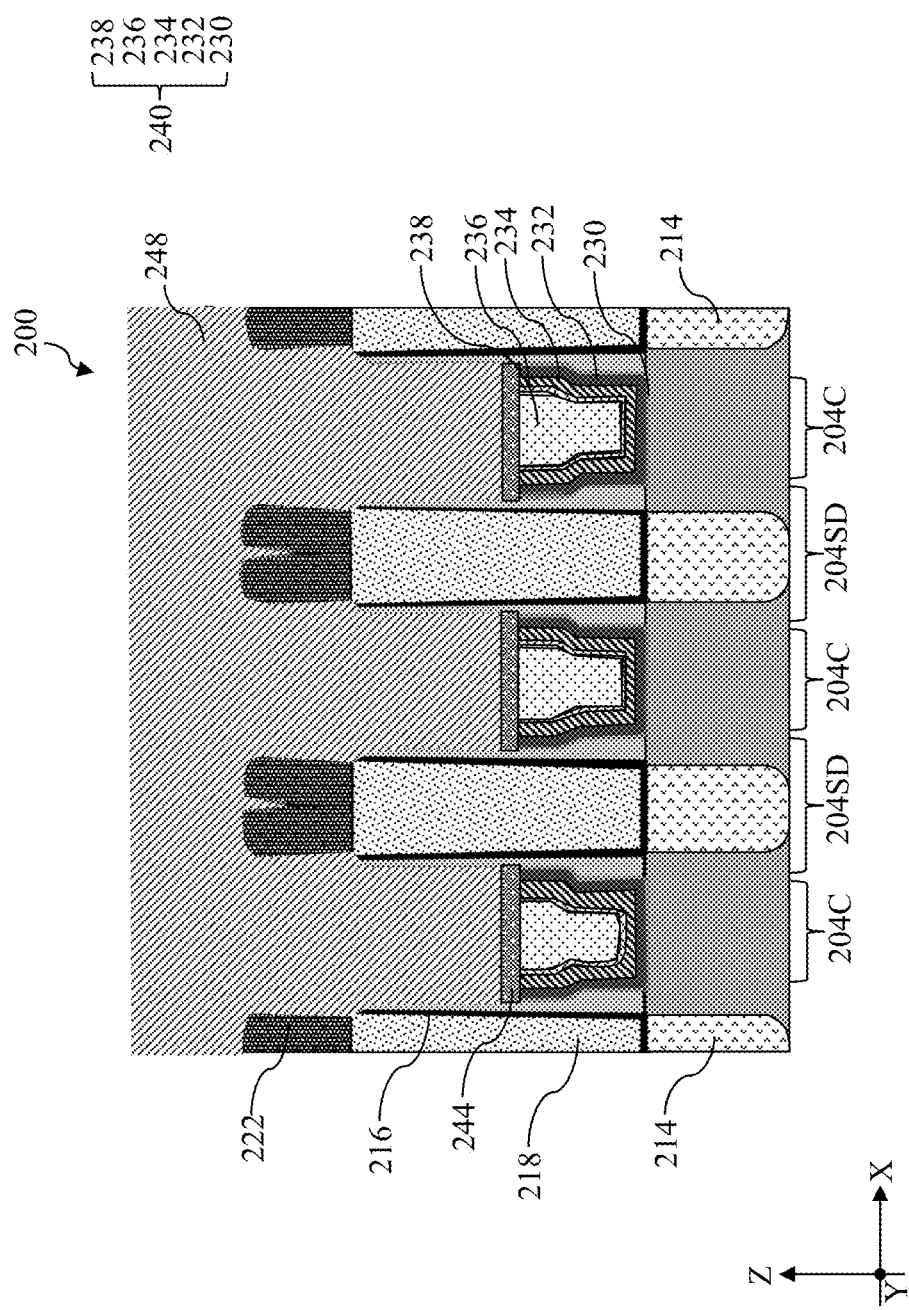

Referring to FIGS. 1 and 13, method 100 includes a block 122 where the gate structure layers are etched back. In some embodiments, the gate structure layers (i.e., the interfacial layer 230, the gate dielectric layer 232, the at least one work function layer 234, the nucleation layer 236, and the metal nitride layer 238) may be etched back using a dry etch, a wet clean, or a combination thereof. An example dry etch process may include use of a fluorocarbon (e.g., $CF_4$, $SF_6$, $NF_3$, $CH_2F_2$, $CHF_3$, and/or $C_2F_6$), a chlorine-containing gas (e.g., $Cl_2$, $CHCl_3$, $CCl_4$, and/or $BCl_3$), oxygen ($O_2$), hydrogen ($H_2$), argon (Ar), or a combination thereof. An example wet clean process may include use of ammonium hydroxide ($NH_4OH$), hydrogen peroxide ($H_2O_2$), hot deionized water (DI water), isopropyl alcohol (IPA), or ozone ($O_3$). The etched-back gate structure layers shown in FIG. 13 may be referred to as a gate structure 240. Because the metal nitride layer 238 does not have a middle seam, the gate structure 240 may have a substantially planar top surface. The etching back of the gate structure layers also create gate top recesses 242.

Figure 16:
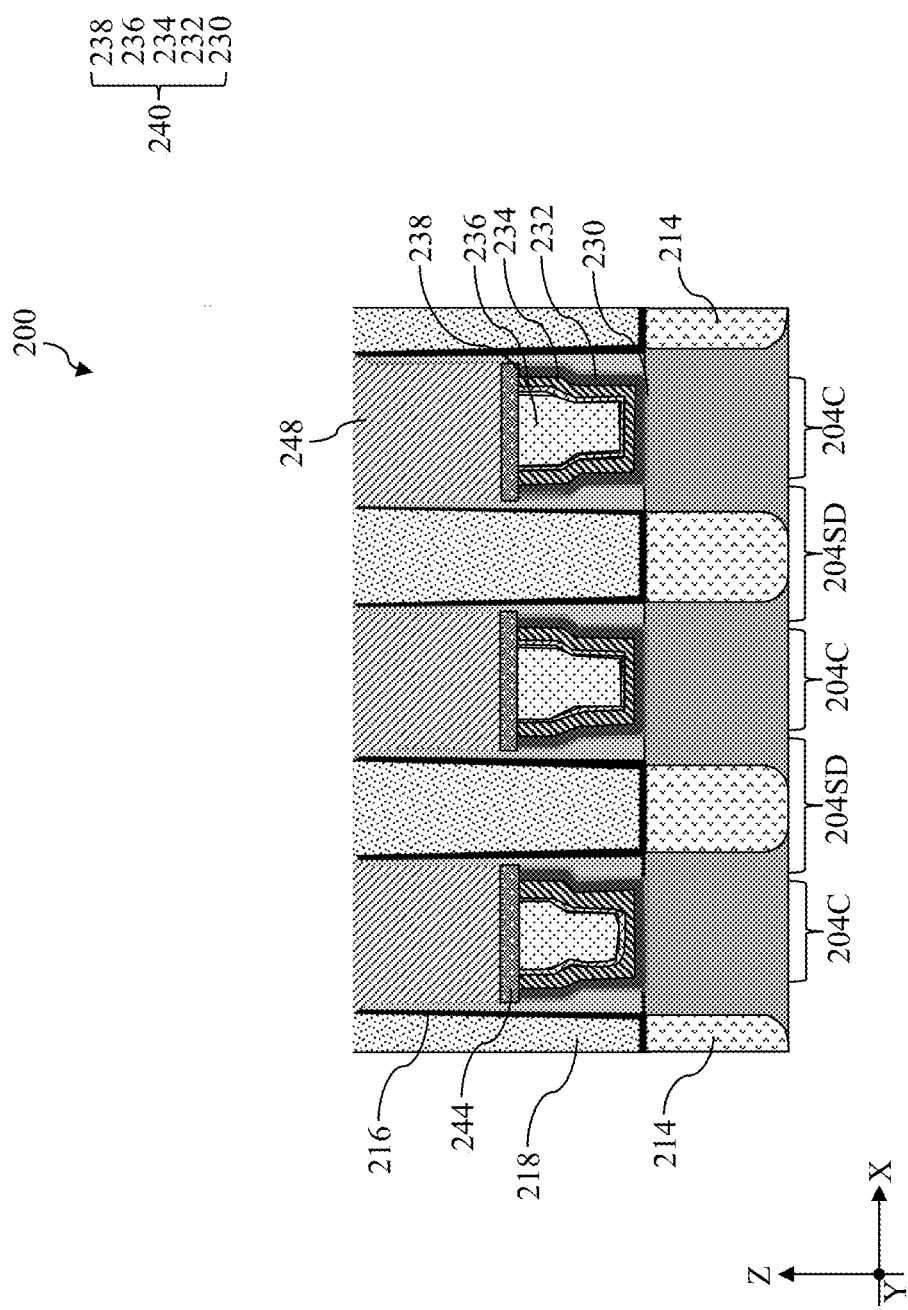

Referring to FIGS. 1 and 14-16, method 100 includes a block 124 where self-alignment structures are formed over the gate structure 240. In the depicted embodiments, the self-alignment structures include a metal cap layer 244 and a dielectric capping layer 248 over the metal cap layer 244. The composition of the metal cap layer 244 is different from the composition of the metal nitride layer 238. In some embodiments, the metal cap layer 244 may include tungsten (W), cobalt (Co), nickel (Ni), molybdenum (Mo), or ruthenium (Ru) and may be deposited over the gate top recesses 242 over the gate structures 240 using atomic layer deposition (ALD), metal organic CVD (MOCVD), or a suitable deposition process. In some instances, the metal cap layer 244 may be selectively deposited on surfaces that are electrically conductive. In one embodiment, the metal cap layer 244 may include tungsten (W). The formation of the metal cap layer 244 may reduce the gate resistance. After the deposition of the metal cap layer 244, the dielectric capping layer 248 is blanketly deposited over the workpiece 200 as illustrate in FIG. 15. The dielectric capping layer 248 may include silicon nitride and may be deposited using CVD. The dielectric capping layer 248 may also be referred to as a self-aligned contact capping (SAC) dielectric layer 248. After the deposition of the dielectric capping layer 248, the workpiece 200 is planarized to remove the hard mask features 222 and provide a planar top surface as shown in FIG. 16.

Figure 17:
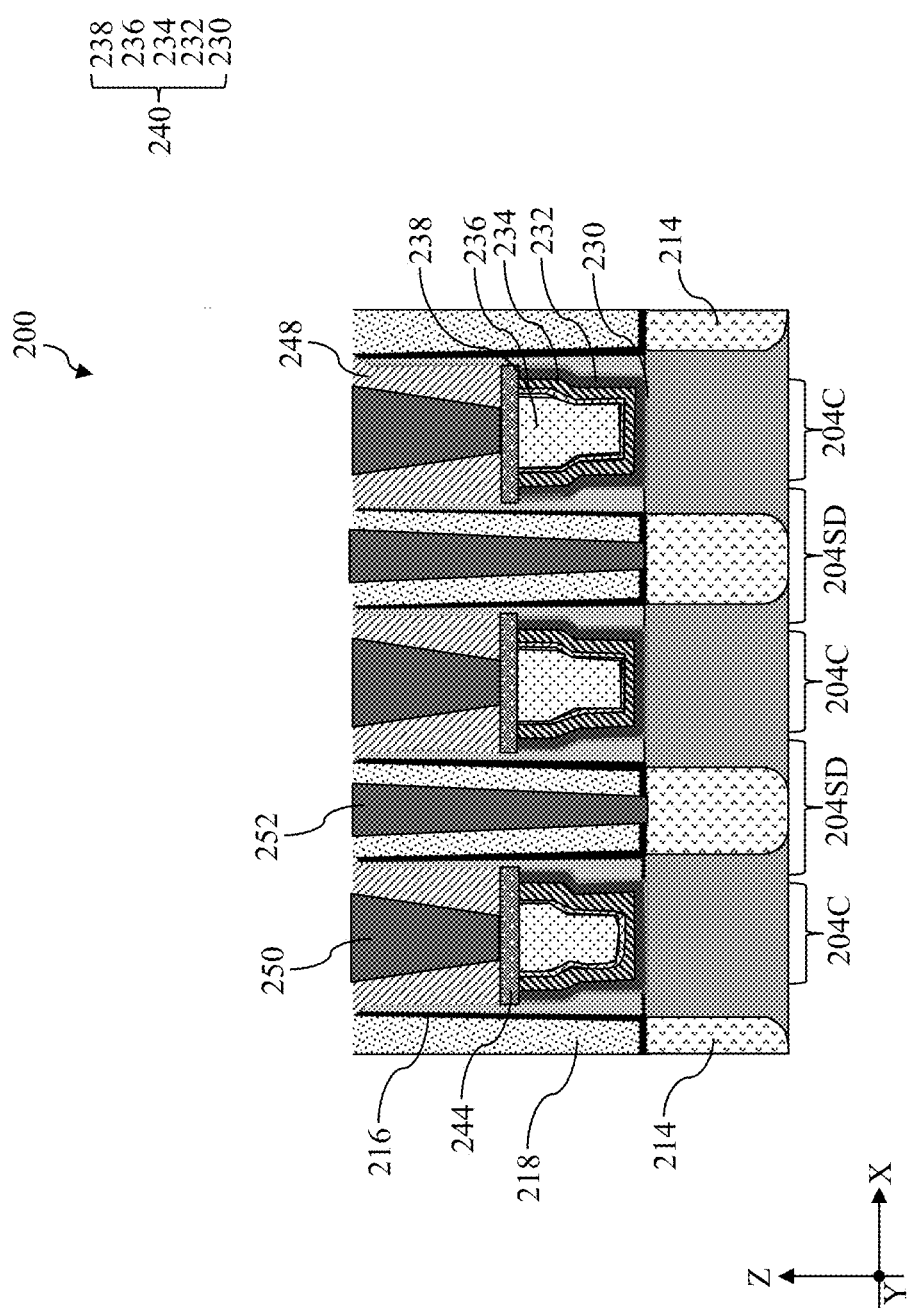

Referring to FIGS. 1 and 17, method 100 includes a block 126 where additional processes are performed. For example, such additional processes may include formation of gate contact vias 250 through the SAC dielectric layer 248 to couple to the metal cap layer 244 of the gate structure 240 and formation of source/drain contacts 252 through the CESL 216 and the ILD layer 218 to couple to the sourced/drain feature 214. In some implementations, the gate via openings for the gate contact vias 250 and the source/drain contact openings for the source/drain contacts 252 are formed separately. In one embodiment, the source/drain contact openings are formed first to expose the source/drain features 214. After formation of a silicide layer (not shown) on the exposed source/drain features 214 and a barrier layer along sidewalls of the source/drain contact openings, a metal fill layer is deposited in the source/drain contact openings. The silicide layer may include titanium silicide, cobalt silicide, or nickel silicide and serves to reduce contact resistance between the source/drain contacts 252 and the source/drain features 214. The barrier layer may include titanium nitride, tantalum nitride, or manganese nitride and serves to prevent electromigration and oxygen diffusion. The metal fill layer may include cobalt (Co), ruthenium (Ru), tungsten (W), copper (Cu), nickel (Ni), a combination thereof. After the formation of the source/drain contacts 252, gate via openings are formed through the SAC dielectric layer 248 to expose the metal cap layer 244. A metal layer is then deposited over the gate via openings to the form the gate contact vias 250. The metal layer for the gate contact vias 250 may include cobalt (Co), ruthenium (Ru), tungsten (W), copper (Cu), nickel (Ni), a combination thereof, or another suitable metal.

Figure 18:
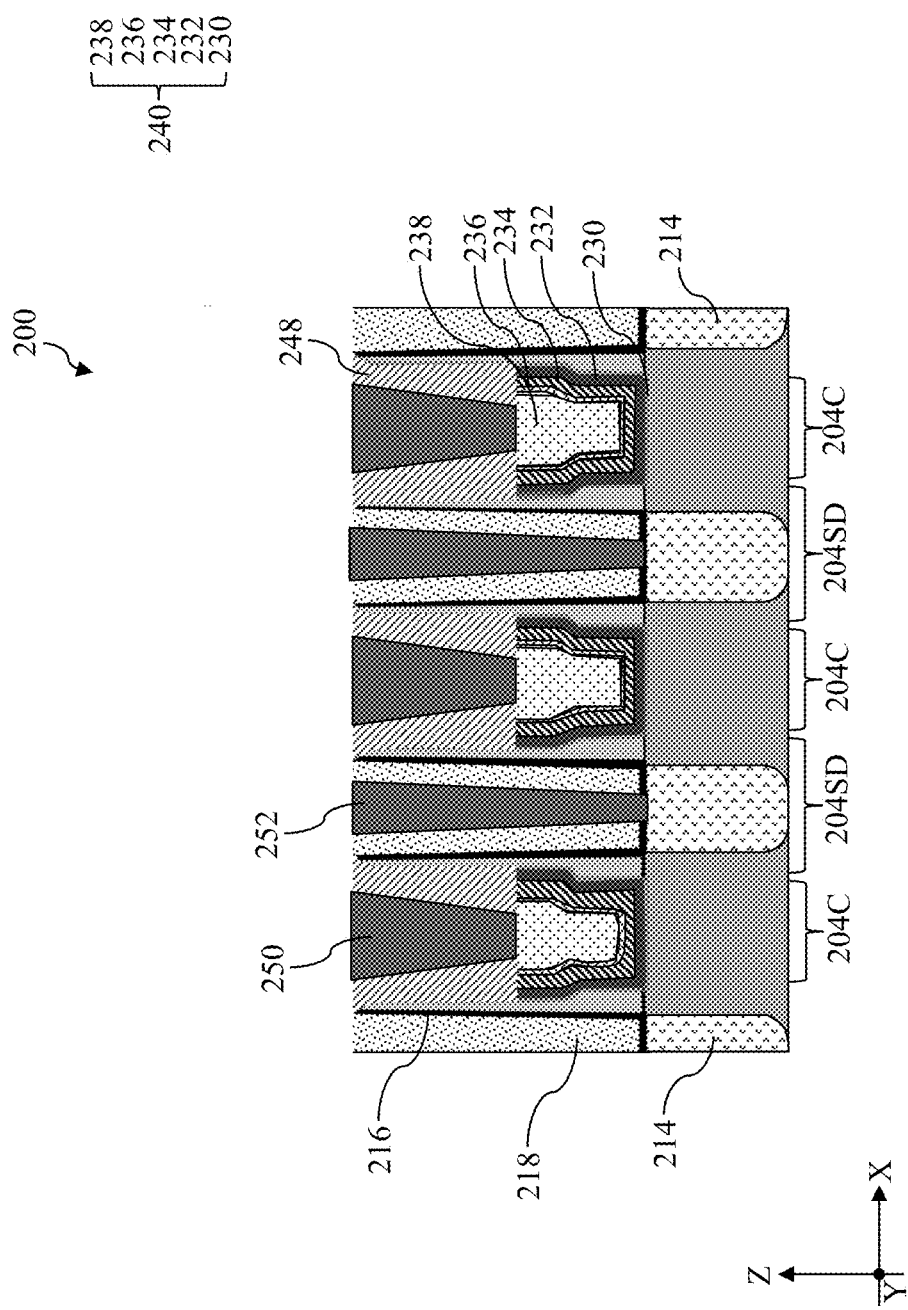

While FIG. 17 illustrates embodiments where the metal cap layer 244 is formed between the gate structure 240 and the gate contact via 250, FIG. 18 illustrates an alternative embodiment where the metal cap layer 244 is omitted. In the embodiments represented in FIG. 18, the gate contact via 250 extends through the SAC dielectric layer 248 to come in direct contact with the metal nitride layer 238.

The disclosure of the present disclosure provides embodiments of semiconductor devices and methods of forming the same. In one embodiment, a method of manufacturing a semiconductor structure is provided. The method includes providing a substrate that includes a dummy gate stack wrapping over an active region and a spacer layer extending along sidewalls of the dummy gate stack, selectively removing the dummy gate stack to form a gate trench exposing the active region, depositing a gate dielectric layer over the active region, depositing at least one work function layer over the gate dielectric layer, depositing a tungsten layer over the at least one work function layer, and depositing a tungsten nitride layer over the tungsten layer.

In some embodiments, the depositing of the tungsten nitride layer includes a plurality of deposition cycles. Each of the plurality of deposition cycles includes a pulse of a tungsten precursor gas, a pulse of a purging inert gas, and a pulse of a reducing gas, and at least one nitrogen plasma treatment pulse. In some implementations, the tungsten precursor gas includes tungsten hexafluoride or tungsten pentachloride. In some instances, the reducing gas includes diborane or silane. In some embodiments, the plurality of deposition cycles includes between 2 and 8 deposition cycles. In some implementations, the depositing of the tungsten layer includes a process temperature between about 275° C. and about 300° C. In some instances, the depositing of the tungsten layer does not include use of nitrogen.

In another embodiment, a method is provided. The method of manufacturing a semiconductor structure includes providing a substrate that includes a first epitaxial feature and a second epitaxial feature, a channel region sandwiched between the first epitaxial feature and the second epitaxial feature, a dummy gate stack wrapping over the channel region, a spacer layer extending along sidewalls of the dummy gate stack, and a dielectric layer disposed over the first epitaxial feature and the second epitaxial feature, selectively etching back the dielectric layer such that a top surface of the dielectric layer is lower than a top surface of the dummy gate stack, after the selectively etching back, conformally depositing a hard mask layer over the dielectric layer, after the conformally depositing, planarizing the substrate to form a hard mask feature over the dielectric layer, after the planarizing, selectively removing the dummy gate stack to form a gate trench exposing the channel region, depositing a gate dielectric layer over the channel region, depositing at least one work function layer over the gate dielectric layer, depositing a tungsten layer over the at least one work function layer using a first atomic layer deposition (ALD) process, and depositing a tungsten nitride layer over the tungsten layer using a second ALD process.

In some embodiments, the hard mask feature includes a middle seam. In some implementations, the tungsten nitride layer includes a grain size smaller than 2 nm. In some instances, the first ALD process includes a plurality of deposition cycles and at least one nitrogen plasma treatment pulse. Each of the plurality of deposition cycles includes a pulse of a tungsten precursor gas, a pulse of a purging inert gas, and a pulse of a reducing gas.

In some embodiments, the tungsten precursor gas includes tungsten hexafluoride or tungsten pentachloride. The purging inert gas is argon and the reducing gas includes diborane or silane. In some implementations, the plurality of deposition cycles includes between 2 and 8 deposition cycles. The method further includes after the depositing of the tungsten nitride layer, etching back the tungsten nitride layer, the at least one work function layer, and the gate dielectric layer to form a gate recess, and depositing a self-aligned capping (SAC) dielectric layer over the gate recess. In some implementations, the method further includes before the depositing of the SAC dielectric layer, depositing a metal capping layer over the gate recess.

In a further embodiment, a semiconductor device is provided. The semiconductor device includes a channel region disposed between a first source/drain feature and a second source/drain feature, a gate structure wrapping over the channel region, and a dielectric capping layer over the tungsten nitride layer. The gate structure includes a high-k gate dielectric layer, at least one work function metal layer over the high-k gate dielectric layer, a tungsten layer over the at least one work function metal layer, and a tungsten nitride layer over the tungsten layer, wherein the tungsten nitride layer includes a grain size smaller than 2 nm.

In some embodiments, the tungsten nitride layer is free of a middle seam. In some implementations, the tungsten nitride layer includes a nitrogen content between about 1% and about 10%. In some instances, the dielectric capping layer includes silicon nitride. In some embodiments, the semiconductor device further includes a metal capping layer between the tungsten nitride layer and the dielectric capping layer. The metal capping layer includes tungsten, molybdenum, or ruthenium.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit-line conductor and word line conductor, one can achieve different resistances for the conductors. However, other techniques to vary the resistances of the metal conductors may also be utilized as well.

What is claimed is:

1. A method of manufacturing a semiconductor structure, comprising:

providing a workpiece that includes:

a first source/drain feature and a second source/drain feature,
a channel region sandwiched between the first source/drain feature and the second source/drain feature,
a dummy gate stack wrapping over the channel region,
a spacer layer extending along sidewalls of the dummy gate stack, and
a dielectric layer disposed over the first source/drain feature and the second source/drain feature;
selectively etching back the dielectric layer such that a top surface of the dielectric layer is lower than a top surface of the dummy gate stack;
after the selectively etching back, conformally depositing a hard mask layer over the dielectric layer;
after the conformally depositing, planarizing the substrate to form a hard mask feature over the dielectric layer;
after the planarizing, selectively removing the dummy gate stack to expose a top surface of the dummy gate stack;
depositing a gate dielectric layer over the channel region;
depositing at least one work function layer over the gate dielectric layer;
depositing a nucleation layer over the at least one work function layer using a first atomic layer deposition (ALD) process; and
depositing a metal nitride layer over the nucleation layer using a second ALD process.

2. The method of claim 1, wherein the hard mask feature comprises a middle seam.

3. The method of claim 1, wherein the metal nitride layer comprises a grain size smaller than 2 nm.

4. The method of claim 1, wherein the second ALD process comprises:
a plurality of deposition cycles, each of the plurality of deposition cycles comprising:
a pulse of a tungsten precursor gas,
a pulse of a purging inert gas, and
a pulse of a reducing gas; and
at least one nitrogen plasma treatment pulse.

5. The method of claim 4,
wherein the tungsten precursor gas comprises tungsten hexafluoride or tungsten pentachloride,
wherein the purging inert gas is argon,
wherein the reducing gas comprises diborane or silane.

6. The method of claim 4, wherein the plurality of deposition cycles comprises between 2 and 8 deposition cycles.

7. The method of claim 4, further comprising:
after the depositing of the metal nitride layer, etching back the nucleation layer, the metal nitride layer, the at least one work function layer, and the gate dielectric layer to form a gate recess; and
depositing a self-aligned capping (SAC) dielectric layer over the gate recess.

8. The method of claim 7, further comprising:
before the depositing of the SAC dielectric layer, depositing a metal capping layer over the gate recess.

9. A method of manufacturing a semiconductor structure, comprising:
providing a workpiece that includes:
a first source/drain feature and a second source/drain feature,
a channel region disposed between the first source/drain feature and the second source/drain feature,
a dummy gate stack wrapping over the channel region,
a spacer layer extending along sidewalls of the dummy gate stack, and
a dielectric layer disposed over the first source/drain feature and the second source/drain feature;
selectively etching back the dielectric layer such that a top surface of the dielectric layer is lower than a top surface of the dummy gate stack;
after the selectively etching back, conformally depositing a hard mask layer over the dielectric layer;
after the conformally depositing, planarizing the workpiece to form a hard mask feature over the dielectric layer;
after the planarizing, selectively removing the dummy gate stack to form a gate trench exposing the channel region;
depositing a gate dielectric layer over the channel region;
depositing at least one work function layer over the gate dielectric layer;
depositing a nucleation layer over the at least one work function layer using a first atomic layer deposition (ALD) process; and
depositing a metal nitride layer over the nucleation layer using a second ALD process,
wherein the second ALD process comprises a treatment of a plasma of a nitrogen-containing gas while the first ALD process does not.

10. The method of claim 9, further comprising:
after the depositing of the metal nitride layer, etching back the nucleation layer, the metal nitride layer, the at least one work function layer, and the gate dielectric layer to form a gate recess; and
depositing a metal cap layer over the gate recess.

11. The method of claim 10, wherein a composition of the metal cap layer is different from a composition of the metal nitride layer.

12. The method of claim 10, wherein the metal cap layer comprises tungsten (W), cobalt (Co), nickel (Ni), molybdenum (Mo), or ruthenium (Ru).

13. The method of claim 10, further comprising:
depositing a dielectric capping layer over the metal cap layer and the hard mask layer.

14. The method of claim 13, further comprising:
planarizing the workpiece to remove the hard mask layer.

15. A method of manufacturing a semiconductor structure, comprising:
providing a workpiece that includes:
a fin comprising a first source/drain region, a second source/drain region, and a channel region between the first source/drain region and the second source/drain region,
a first source/drain feature over the first source/drain region,
a second source/drain feature over the second source/drain region,
a dummy gate stack disposed over the channel region,
a spacer layer extending along sidewalls of the dummy gate stack, and
an interlayer dielectric (ILD) layer disposed over the first source/drain feature and the second source/drain feature;
selectively etching back the ILD layer such that a top surface of the ILD layer is lower than a top surface of the dummy gate stack;
after the selectively etching back, conformally depositing a hard mask layer over the ILD layer;
after the conformally depositing, planarizing the workpiece to form a hard mask feature such that top surfaces of the hard mask feature and the dummy gate stack are coplanar;

selectively removing the dummy gate stack to form a gate trench exposing the channel region;
depositing a gate dielectric layer over the channel region;
depositing at least one work function layer over the gate dielectric layer;
depositing a nucleation layer over the at least one work function layer using a first atomic layer deposition (ALD) process;
depositing a metal nitride layer over the nucleation layer using a second ALD process;
etching back the metal nitride layer to form a gate top recess; and
depositing a metal cap layer over the gate top recess.

16. The method of claim 15, wherein the first ALD process comprises:
a first plurality of deposition cycles, each of the first plurality of deposition cycles comprising:
a pulse of a tungsten precursor gas,
a pulse of a purging inert gas, and
a pulse of a reducing gas.

17. The method of claim 15, wherein the first ALD process comprises a process temperature between about 275° C. and about 300° C.

18. The method of claim 16, wherein the second ALD process comprises:
a second plurality of deposition cycles, each of the second plurality of deposition cycles comprising:
a pulse of the tungsten precursor gas,
a pulse of the purging inert gas, and
a pulse of the reducing gas; and
at least one plasma treatment pulse using a nitrogen-containing gas.

19. The method of claim 16,
wherein the tungsten precursor gas comprises tungsten pentachloride ($WCl_5$) or tungsten hexafluoride ($WF_6$),
wherein the reducing gas comprises diborane ($B_2H_6$), silane ($SiH_4$), hydrogen ($H_2$), or a combination thereof.

20. The method of claim 18, wherein the nitrogen-containing gas comprises nitrogen ($N_2$), ammonia ($NH_3$), or a mixture of nitrogen ($N_2$) and hydrogen ($H_2$).

* * * * *